United States Patent [19]

Nakagawa

[11] Patent Number: 4,508,813
[45] Date of Patent: Apr. 2, 1985

[54] METHOD FOR PRODUCING NEGATIVE RESIST IMAGES

[75] Inventor: Takayuki Nakagawa, Shimodate, Japan

[73] Assignee: Fujitsu Limited, Kawasaki, Japan

[21] Appl. No.: 315,904

[22] Filed: Oct. 28, 1981

Related U.S. Application Data

[63] Continuation of Ser. No. 159,520, Jun. 16, 1980, abandoned.

[51] Int. Cl.$^3$ ............................................. G03C 5/00
[52] U.S. Cl. .................................. 430/296; 430/325; 430/328; 430/330; 430/311; 430/327
[58] Field of Search ............. 430/147, 296, 325, 328, 430/311, 330, 327

[56] References Cited

U.S. PATENT DOCUMENTS

| | | | |
|---|---|---|---|
| 3,264,104 | 8/1966 | Reichel | 430/304 |
| 3,890,152 | 6/1975 | Ruckert et al. | 430/325 |
| 4,104,070 | 8/1978 | Moritz | 430/296 |

*Primary Examiner*—Won H. Louie
*Attorney, Agent, or Firm*—Staas & Halsey

[57] ABSTRACT

A method for producing a negative resist image is disclosed, which method comprises exposing a film of a diazo-type resist material, which is free from 1-hydroxyethyl-2-alkylimidazoline, to electron beam radiation in a predetermined pattern, heat treating said patternwise exposed resist film, subjecting said heat treated film to overall exposure to ultraviolet radiation and, then, developing the so treated film to remove the resist material in the area not exposed to electron beam radiation.

8 Claims, 3 Drawing Figures

METHOD FOR PRODUCING NEGATIVE RESIST IMAGES

This is a continuation of application Ser. No. 159,520 filed June 16, 1980, now abandoned.

BACKGROUND OF THE INVENTION

The present invention relates to a method for producing negative resist images using a diazo-type resist material.

It is well known that a diazo-type resist material consisting essentially of a phenol-formaldehyde novolak resin containing about 10% by weight of a naphthoquinone diazide forms a photosensitive film usable for producing a positive resist image by irradiation of the film with ultraviolet radiation in a desired pattern. On the other hand, conventional negative resist materials generally have a drawback in that, in the case where a fine pattern is to be formed, undesirable bridging between the pattern-composing lines may occur in the resulting image.

SUMMARY OF THE INVENTION

It has now been found that a diazo-type resist material as mentioned above can be advantageously used as a negative resist material for producing a fine resist pattern under a specific condition as hereinbelow defined.

The present invention provides a method for producing a negative resist image, comprising exposing a film of a diazo-type resist material, which is free from 1-hydroxyethyl-2-alkylimidazoline, to electron beam radiation in a predetermined pattern, heat treating said patternwise exposed resist film, subjecting said heat treated film to overall exposure to ultraviolet radiation and, then, developing the so treated film to remove the resist material in the area not exposed to electron beam radiation. In this method, the patternwise exposure to electron beam radiation may preferably be carried out at a current density of not more than 40 A/cm$^2$. The heat treatment after the patternwise electron beam exposure may preferably be carried out at a temperature of not higher than 100° C.

DETAILED DESCRIPTION OF THE PREFERRED EMBODIMENTS

According to the method of the present invention, a diazo-type resist material consisting essentially of a phenol-formaldehyde novolak resin containing about 10% by weight of a naphthoquinone diazide can advantageously be utilized as a negative resist material which has a resolving power highly superior to those of conventional negative resist materials and which produces a resist mask excellent in the resistance to dry etching operations in the manufacturing of microcircuits. Further, since such a diazo-type resist material can, of course, be employed as a usual positive resist material, a film of such a diazo-type resist material can be used for producing both a positive resist image by a conventional method and a negative resist image by the method of the present invention.

The present invention will further be illustrated below using AZ 1350 J (trade mark, Shipley Inc.) as an example of the diazo-type resist material.

Figure 1:
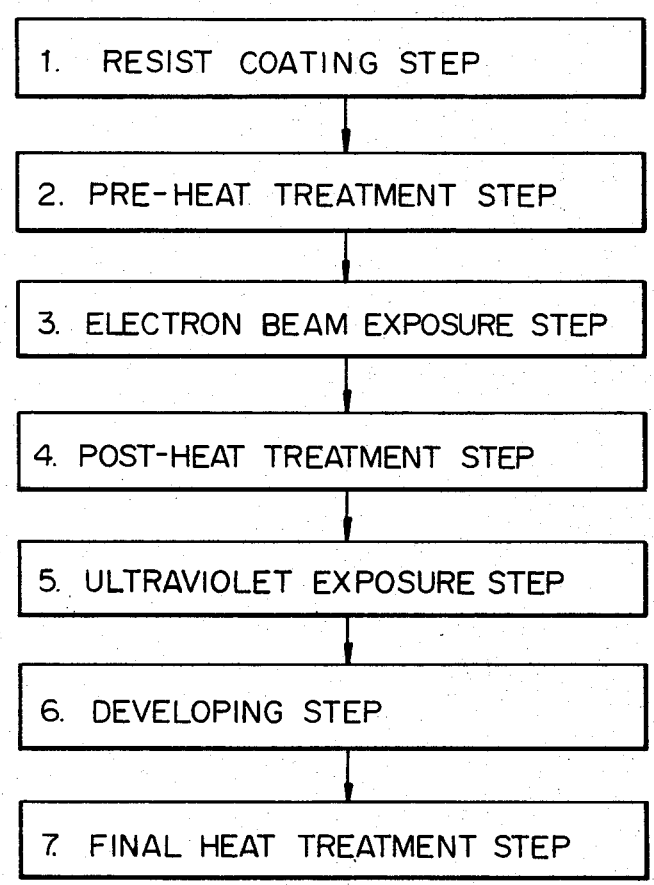
FIG. 1 indicates the process steps of the present invention.

FIG. 1 indicates the steps in a process for practicing the method of the present invention. Referring to FIG. 1, in a resist coating step 1, AZ 1350 J is coated on a substrate to produce a resist film. After the resist coating step, the coated resist film is heat treated appropriately at a temperature of 80° to 95° C., for 20 min., in a pre-heat treatment step 2. A pre-heat treatment at a higher temperature may disadvantageously result in the lowering of the solubility of the film in a developer, in the area not exposed to electron beam radiation, when the film is developed.

The resist film is then exposed to electron beam radiation in a predetermined pattern in an electron beam exposure step 3. If the irradiation of the film with electron beam radiation is carried out at a high radiation dose, there may be obtained an advantage that the film is rapidly dissolved in a developer in the area not exposed to electron beam radiation. However, there may occur disadvantages in that a long exposure time is necessary and fogging is produced due to the scattering of electrons. Therefore, the irradiation of the resist film with electron beam radiation may appropriately be effected to a radiation dose such that about 70% of the resist film thickness is retained in the area of the film exposed to electron beam radiation after the development of the film.

Figure 2:
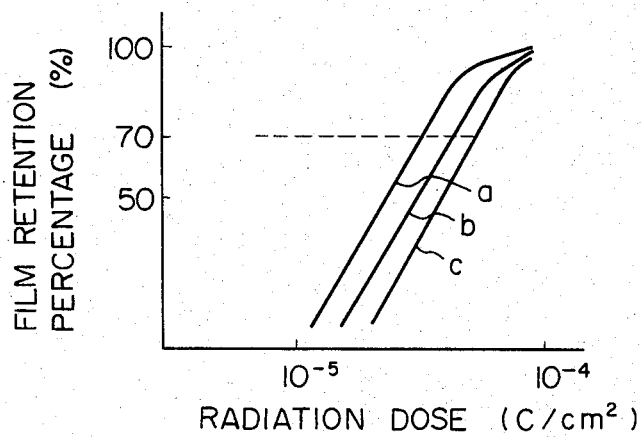
FIG. 2 shows the relative amount of film retention as a function of radiation dose for different heat treatment.

FIG. 2 is a graph illustrating the relationship between the film retention percentage (%) and the electron beam radiation dose (coulomb/cm$^2$). The "film retention percentage" refers to the percentage of the film thickness after development to the film thickness before development. In the figure, curve a shows a case where the heat treatment after the electron beam exposure was carried out at 100° C., curve b shows a case where the heat treatment after the electron beam exposure was carried out at 80° C., and curve c shows a case where the heat treatment after the electron beam exposure was not carried out.

Figure 3:
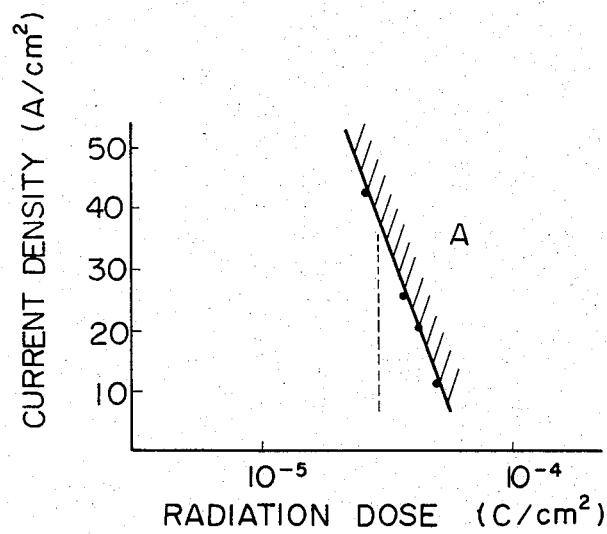
FIG. 3 shows where bubbling begins to occur for different combinations of radiation dose and current density.

If the diazo-type resist material is irradiated excessively by electron beam radiation, so called "bubbling" occurs in the resist film. In FIG. 3, there is shown an area A in which the bubbling occurs in relation to the current density (ampere/cm$^2$) and the electron beam radiation dose (coulomb/cm$^2$). In this case, the pre-heat treatment was carried out at 80° C. and the heat treatment after the electron beam exposure was carried out at 100° C.

Referring again to FIG. 1, after the electron beam exposure step, the film is subjected to a post-heat treatment step 4. In this step, the heat treatment may be appropriately carried out at a temperature of not higher than 100° C. for about 20 min. If the heat treatment is carried out at a temperature higher than 100° C., the resulting resist image may often have a drawback in that the image is inferior in sharpness.

The treated film is then subjected to overall exposure to ultraviolet radiation in an ultraviolet exposure step 5. The irradiation may preferably be effected at a radiation dose of 100 to 400 mW.sec/cm$^2$. Then, the film is developed in an alkaline developer MF312 (trade mark, Shipley Inc.) in a developing step 6. Preferably, the developer is diluted by an equal amount of water. After the developing step, the film is heat treated in final heat treatment step 7.

EXAMPLE

A diazo-type resist material, AZ 1350 J, was coated on the surface of an aluminum layer on a Silicon wafer (500 $\mu$m), on which a silica layer (0.5$\mu$m) and then the aluminum layer (1$\mu$m) were grown, by a spin coater and heat treated in an air oven at 80° C. for 20 min. to obtain a dry resist film if 1.2$\mu$ on the support. The film was then exposed to electron beam radiation, in a desired pattern, in a vaccum at a current density for 30 ampere/cm$^2$ and, then, baked in an air oven, at 90° C., for 20 min. The film was then exposed to ultraviolet radiation in a photoaligner at 300 mW.sec/cm$^2$. Then, the film was developed in an alkaline developer containing equal amounts of MF 312 and water. Thus, a negative resist image of a fine pattern was obtained.

The resulting resist mask was superior to resist masks obtained from conventional electron beam resist materials, in the resistance to dry etching operations, and the aluminum layer of the substrate on which said resist mask was formed could be etched in a gas based on BCl$_3$ or CCl$_4$.

What is claimed is:

1. A method for producing a negative resist image for producing finely patterned microcircuits, said method comprising exposing a film of a diazo-type resist material consisting essentially a phenol-formaldehyde novolak resin containing about 10% by weight of a naphthoquinone diazide, said resist material being free from 1-hydroxyethyl-2-alkylimidazoline, to electron beam radiation in a predetermined fine pattern corresponding to said image for producing said microcircuits, heat treating said patternwise exposed resist film, subjecting said heat treated film to overall exposure to ultraviolet radiation and developing the so treated film to remove the resist material in the area of said pattern that is not exposed to said electron beam radiation.

2. A method according to claim 1, wherein said patternwise exposure to electron beam radiation is carried out at a current density of not more than 40 A/cm$^2$.

3. The method of claim 2, wherein said electron beam exposure comprises a radiation dose such that about 70% of the resist film thickness is retained in the area exposed to electron beam radiation after the development of the film.

4. The method of claim 1, 2 or 3, wherein said heat treatment is carried out at a temperature of not higher than 100° C.

5. The method of claim 1, 2 or 3, wherein said overall ultraviolet exposure is to a radiation dose in the range from 100 to 400 mW sec/cm$^2$.

6. The method of claim 1, 2 or 3, comprising preheating said film of diazo-type resist material at a temperature in the range from 80° to 95° C. for 230 minutes prior to said electron beam exposure.

7. The method of claim 4, comprising preheating said film of diazo-type resist material at a temperature in the range from 80° to 95° C. for 230 minutes prior to said electron beam exposure.

8. The method of claim 5, comprising preheating said film of diazo-type resist material at a temperature in the range from 80° to 95° C. for 230 minutes prior to said electron beam exposure.

* * * * *

UNITED STATES PATENT AND TRADEMARK OFFICE
CERTIFICATE OF CORRECTION

PATENT NO.   :   4,508,813
DATED        :   Apr. 2, 1985
INVENTOR(S)  :   TAKAYUKI NAKAGAWA

It is certified that error appears in the above-identified patent and that said Letters Patent is hereby corrected as shown below:

Column 2, line 65, "mW.sec" should be --mW·sec--.

Column 3, line 6, "Silicon" should be --silicon--;
         line 10, "if" should be --of--;
         line 15, "mW.sec" should be --mW·sec--;

Signed and Sealed this

Fifth Day of November 1985

[SEAL]

Attest:

DONALD J. QUIGG

Attesting Officer

Commissioner of Patents and Trademarks